(12) United States Patent
Chang et al.

(10) Patent No.: US 11,342,916 B2
(45) Date of Patent: May 24, 2022

(54) SCHOTTKY-CMOS ASYNCHRONOUS LOGIC CELLS

(71) Applicant: Schottky LSI, Inc., Mountain View, CA (US)

(72) Inventors: Augustine Wei-Chun Chang, Mountain View, CA (US); Pierre Dermy, Reno, NV (US)

(73) Assignee: SCHOTTKY LSI, INC., Mountain View, CA (US)

( * ) Notice: Subject to any disclaimer, the term of this patent is extended or adjusted under 35 U.S.C. 154(b) by 0 days.

(21) Appl. No.: 16/883,753

(22) Filed: May 26, 2020

(65) Prior Publication Data
US 2020/0287546 A1 Sep. 10, 2020

Related U.S. Application Data

(60) Continuation of application No. 15/817,026, filed on Nov. 17, 2017, now Pat. No. 10,666,260, which is a
(Continued)

(51) Int. Cl.
*H03K 19/09* (2006.01)
*H03K 19/0956* (2006.01)
(Continued)

(52) U.S. Cl.
CPC ....... *H03K 19/0956* (2013.01); *H01L 25/065* (2013.01); *H01L 27/0207* (2013.01);
(Continued)

(58) Field of Classification Search
CPC ......... H03K 19/0956; H03K 19/01707; H03K 19/0948; H03K 19/17728; H01L 25/065;
(Continued)

(56) References Cited

U.S. PATENT DOCUMENTS 3,508,211 A 4/1970 Wegener
3,978,577 A 9/1976 Bhattacharyya et al.
(Continued)

FOREIGN PATENT DOCUMENTS

GB 2054955 A 2/1981

OTHER PUBLICATIONS

Ashby, L, et al., ASIC Clock Distribution Using a Phase Locked Loop (PLL), Motorola AN1509, IEEE Xplore Digital Library, US, Sep. 1991 (Abstract).
(Continued)

*Primary Examiner* — Charles D Garber
*Assistant Examiner* — S M Sohel Imtiaz
(74) *Attorney, Agent, or Firm* — Morgan, Lewis & Bockius LLP

(57) ABSTRACT

Integrated circuits described herein implement an x-input logic gate. The integrated circuit includes a plurality of Schottky diodes that includes x Schottky diodes and a plurality of source-follower transistors that includes x source-follower transistors. Each respective source-follower transistor of the plurality of source-follower transistors includes a respective gate node that is coupled to a respective Schottky diode. A first source-follower transistor of the plurality of source-follower transistors is connected serially to a second source-follower transistor of the plurality of source-follower transistors.

14 Claims, 12 Drawing Sheets

Related U.S. Application Data continuation of application No. 15/484,040, filed on Apr. 10, 2017, now Pat. No. 9,853,643, which is a continuation-in-part of application No. 15/358,049, filed on Nov. 21, 2016, now Pat. No. 9,806,072, and a continuation-in-part of application No. PCT/US2015/055020, filed on Oct. 9, 2015, and a continuation of application No. 14/793,690, filed on Jul. 7, 2015, now Pat. No. 9,502,379, which is a continuation of application No. 13/931,315, filed on Jun. 28, 2013, now Pat. No. 9,077,340, which is a division of application No. 12/343,465, filed on Dec. 23, 2008, now Pat. No. 8,476,689.

(60) Provisional application No. 62/062,800, filed on Oct. 10, 2014.

(51) Int. Cl.
| | |
|---|---|
| *H03K 19/0948* | (2006.01) |
| *H03K 19/017* | (2006.01) |
| *H01L 27/11546* | (2017.01) |
| *H01L 27/118* | (2006.01) |
| *H01L 31/0376* | (2006.01) |
| *H03K 19/17728* | (2020.01) |
| *H01L 25/065* | (2006.01) |
| *H01L 31/032* | (2006.01) |
| *H01L 27/112* | (2006.01) |
| *H01L 27/105* | (2006.01) |
| *H01L 27/108* | (2006.01) |
| *H01L 31/074* | (2012.01) |
| *H01L 27/02* | (2006.01) |
| *H01L 27/11526* | (2017.01) |
| *H01L 31/072* | (2012.01) |
| *H01L 49/02* | (2006.01) |

(52) U.S. Cl.
CPC ...... *H01L 27/105* (2013.01); *H01L 27/10897* (2013.01); *H01L 27/112* (2013.01); *H01L 27/11253* (2013.01); *H01L 27/11286* (2013.01); *H01L 27/11293* (2013.01); *H01L 27/11526* (2013.01); *H01L 27/11546* (2013.01); *H01L 27/11807* (2013.01); *H01L 28/00* (2013.01); *H01L 31/032* (2013.01); *H01L 31/0376* (2013.01); *H01L 31/072* (2013.01); *H01L 31/074* (2013.01); *H03K 19/01707* (2013.01); *H03K 19/0948* (2013.01); *H03K 19/17728* (2013.01); *H01L 28/20* (2013.01); *H01L 2924/0002* (2013.01); *Y02E 10/50* (2013.01)

(58) Field of Classification Search
CPC ............ H01L 27/0207; H01L 27/105; H01L 27/10897; H01L 27/112; H01L 27/11253; H01L 27/11286; H01L 27/11293; H01L 27/11526; H01L 27/11546; H01L 27/11807; H01L 28/00; H01L 31/032; H01L 31/0376; H01L 31/072; H01L 31/074

See application file for complete search history.

(56) References Cited

U.S. PATENT DOCUMENTS

| | | | |
|---|---|---|---|
| 4,005,469 A | 1/1977 | Chang et al. | |
| 4,050,058 A | 9/1977 | Garlic | |
| 4,129,790 A | 12/1978 | Gani et al. | |
| 4,300,064 A | 11/1981 | Eden | |
| 4,336,601 A | 6/1982 | Tanaka | |
| 4,400,636 A | 8/1983 | Andrade | |
| 4,405,870 A | 9/1983 | Eden | |
| 4,415,817 A | 11/1983 | Fletcher | |
| 4,507,575 A | 3/1985 | Mori et al. | |
| 4,544,939 A | 10/1985 | Kosonocky et al. | |
| 4,609,903 A | 9/1986 | Toyokura et al. | |
| 4,709,166 A | 11/1987 | Banker et al. | |
| 4,931,670 A | 6/1990 | Ting | |
| 5,010,377 A * | 4/1991 | Beasom ................. H01L 21/82 257/274 |
| 5,023,482 A * | 6/1991 | Bellavance ......... H01L 27/0233 257/477 |
| 5,407,851 A | 4/1995 | Roesner | |
| 5,581,503 A | 12/1996 | Matsubara et al. | |
| 5,663,584 A | 9/1997 | Welch | |
| 5,665,993 A | 9/1997 | Keller et al. | |
| 6,025,840 A | 2/2000 | Taylor | |
| 6,036,101 A | 3/2000 | Hass et al. | |
| 6,184,726 B1 | 2/2001 | Haeberli et al. | |
| 6,442,633 B1 | 8/2002 | Chang | |
| 6,590,000 B2 | 7/2003 | Varadaraj | |
| 6,590,800 B2 | 7/2003 | Chang | |
| 6,627,697 B2 | 9/2003 | Barney et al. | |
| 6,777,277 B2 | 8/2004 | Asano et al. | |
| 6,852,578 B2 | 2/2005 | Chang | |
| 7,082,056 B2 | 7/2006 | Chen et al. | |
| 7,135,890 B2 | 11/2006 | Chang | |
| 7,375,547 B2 | 5/2008 | Shimura | |
| 7,375,548 B2 | 5/2008 | Chang | |
| 7,528,017 B2 | 5/2009 | Subramanian et al. | |
| 7,683,433 B2 | 3/2010 | Kapoor et al. | |
| 7,932,537 B2 | 4/2011 | Subramanian et al. | |
| 8,476,689 B2 | 7/2013 | Chang | |
| 9,077,340 B2 | 7/2015 | Chang | |
| 9,806,072 B2 | 10/2017 | Chang | |
| 10,373,950 B2 | 8/2019 | Chang | |
| 2003/0002321 A1 | 1/2003 | Chang | |
| 2003/0025175 A1 | 2/2003 | Asano et al. | |
| 2004/0159910 A1 | 8/2004 | Fried et al. | |
| 2005/0062071 A1 | 3/2005 | Matsuzawa et al. | |
| 2005/0231237 A1* | 10/2005 | Chang ................. H03K 19/0002 326/41 |
| 2006/0044018 A1* | 3/2006 | Chang ................. H01L 27/0207 326/101 |
| 2006/0113624 A1 | 6/2006 | Wu | |
| 2006/0279321 A1* | 12/2006 | Ruppender ............ G09G 3/006 324/750.3 |
| 2007/0018692 A1 | 1/2007 | Chang | |
| 2007/0120201 A1 | 5/2007 | Yamaguchi et al. | |
| 2008/0036503 A1 | 2/2008 | Chang | |
| 2008/0061824 A1 | 3/2008 | Chang | |
| 2008/0107974 A1* | 5/2008 | Douzaka .................. G03F 1/30 430/5 |
| 2010/0155782 A1 | 6/2010 | Chang | |
| 2010/0228377 A1 | 9/2010 | D'Angelo et al. | |
| 2011/0204381 A1 | 8/2011 | Okada et al. | |
| 2014/0152343 A1 | 6/2014 | Chang | |

OTHER PUBLICATIONS

Chang, Office Action, U.S. Appl. No. 12/343,465, dated Mar. 21, 2011, 10 pgs.

Chang, Office Action, U.S. Appl. No. 12/343,465, dated Nov. 28, 2011, 5 pgs.

Chang, Office Action, U.S. Appl. No. 12/343,465, dated Oct. 1, 2012, 10 pgs.

Chang, Office Action, U.S. Appl. No. 12/343,465, dated Mar. 30, 2012, 5 pgs.

Chang, Notice of Allowance, U.S. Appl. No. 12/343,465, dated Mar. 4, 2013, 5 pgs.

Chang, Office Action, U.S. Appl. No. 14/793,690, dated Feb. 22, 2016, 6 pgs.

Chang, Office Action, U.S. Appl. No. 15/358,049, dated Mar. 10, 2017, 6 pgs.

Chang, Notice of Allowance, U.S. Appl. No. 15/358,049, dated Jun. 29, 2017, 5 pgs.

(56) References Cited

OTHER PUBLICATIONS

Chang, Notice of Allowance, U.S. Appl. No. 15/484,040, dated Aug. 16, 2017, 9 pgs.
Chang, Office Action, U.S. Appl. No. 15/817,026, dated Nov. 27, 2018, 15 pgs.
Chang, Final Office Action, U.S. Appl. No. 15/817,026, dated Jul. 11, 2019, 15 pgs.
Chang, Office Action, U.S. Appl. No. 15/799,921, dated Oct. 31, 2018, 7 pgs.
Chang, Notice of Allowance, U.S. Appl. No. 15/799,921, dated Mar. 21, 2019, 8 pgs.
Fuller, "Solar Cell Notes from Sze", PN Junction Cell, CdS cell, Raynolds Sigle/Poly Si Crystal and Amorphous Thin Film, US, 1954 (17 pages).
Gerrits, J., et al., Modeling and Simulation of a Dipole Antenna for UWB Applications Using Equivalent Spice Circuits, Centre Suisse d'Eiectronique et de Microtechnique SA (CSEM), Neuchatei-Switzerland, 2003, (5 pages).
Katz, David, et al., Fundamentals of Embedded Audio, Part 1, DSP Design Line, Analog Devices, Sep. 3, 2007 (8 pages).
Katz, David, et al., Fundamentals of Embedded Audio, Part 2, DSP Design Line, Analog Devices, Sep. 10, 2007 (12 pages).
Katz, David, et al.. Fundamentals of Embedded Audio, Part 3, DSP Design Line, Video Imaging Design Line, Sep. 17, 2007 (8 pages).
Liu, Yang, et al., IC/Microfluidic Hybrid System for Biology 2005: Review, (Invited Paper) IEEE BCTM10.4, 2005, Harvard University, Cambridge, MA 02138, US (8 pages).
Schottky LSI, Inc., International Search Report and Written Opinion, PCT/US2015/055020, dated Jan. 27, 2016, 9 pgs.
Schottky LSI, Inc., International Preliminary Report on Patentability, PCT/US2015/055020, dated Apr. 11, 2017, 7 pgs.
Schottky LSI, Inc., Communication Pursuant to Rules 161(2) and 162-EP15849239.7, dated Jun. 2, 2017, 2 pgs.
Schottky LSI, Inc., Extended European Search Report. EP15849239.7, dated May 8, 2018, 13 pgs.
Yang, Jeffrey, et al., A-Si Solar Cell White Paper, Amorphous Silicon Based Photovoltaics—From Earth to the "Final Frontier", US, 2003, (10 pages).
Yang, Jeffrey, et al., Amorphous Silicon Based Photovoltaics—From Earth to the "Final Frontier", 78 2003 pp. 597-612, Solar Energy Materials & Solar Cells, US, pp. 23-1 thru 23-24
Zhu, Z., et al., Brief Comparison of Different Rectifier Strutures for RFID Transponders, Auto-ID Lab at Univeristy of Adelaide, North Terrace, Adelaide, Australia 2004, pp. 1-16.
Chang, Non-Final Office Action, U.S. Appl. No. 16/532,227, dated Feb. 20, 2020, 6 pgs.
Chang, Final Office Action, U.S. Appl. No. 16/532,227, dated Sep. 17, 2020, 9 pgs.
Chang, Notice of Allowance, U.S. Appl. No. 16/532,227, dated Jan. 27, 2021, 8 pgs.

\* cited by examiner

SCHOTTKY-CMOS ASYNCHRONOUS LOGIC CELLS

CROSS-REFERENCES TO RELATED APPLICATIONS

This application is a continuation of U.S. patent application Ser. No. 15/817,026, filed Nov. 17, 2017, entitled "Schottky-CMOS Asynchronous Logic Cells," which is a continuation of and claims priority to U.S. patent application Ser. No. 15/484,040, filed Apr. 10, 2017, entitled, "Schottky-CMOS Asynchronous Logic Cells," both of which are hereby incorporated by reference in their entirety. U.S. patent application Ser. No. 15/484,040 is a continuation-in-part of PCT Patent Application No. PCT/US2015/055020, filed Oct. 9, 2015, entitled, "SUPER CMOS (SCMOS™) DEVICES ON A MICROELECTRONIC SYSTEM," which claims priority to U.S. Provisional Patent Application No. 62/062,800, filed Oct. 10, 2014, entitled, "SUPER CMOS (SCMOS) DEVICES ON A MICROELECTRONIC SYSTEM," both of which are hereby incorporated by reference in their entirety. U.S. patent application Ser. No. 15/484,040 is also a continuation-in-part of and claims priority to U.S. patent application Ser. No. 15/358,049, filed Nov. 21, 2016, entitled, "SUPER CMOS DEVICES ON A MICROELECTRONICS SYSTEM," now U.S. Pat. No. 9,806,072, issued Oct. 31, 2017, which is hereby incorporated by reference in its entirety. U.S. patent application Ser. No. 15/358,049 is a continuation of and claims priority to U.S. patent application Ser. No. 14/793,690, filed Jul. 7, 2015, now U.S. Pat. No. 9,502,379, entitled, "SUPER CMOS DEVICES ON A MICROELECTRONICS SYSTEM," which claims priority to U.S. Provisional Patent Application No. 62/062,800, filed Oct. 10, 2014, all of which are hereby incorporated by reference in their entirety. U.S. patent application Ser. No. 14/793,690 is a continuation application of and claims priority to U.S. patent application Ser. No. 13/931,315, filed Jun. 28, 2013, now U.S. Pat. No. 9,077,340, entitled, "SUPER CMOS DEVICES ON A MICROELECTRONICS SYSTEM," which is a divisional application of and claims priority to U.S. patent application Ser. No. 12/343,465, filed Dec. 23, 2008, now U.S. Pat. No. 8,476,689 entitled, "SUPER CMOS DEVICES ON A MICROELECTRONICS SYSTEM," all of which are hereby incorporated by reference in their entirety.

TECHNICAL FIELD

The present application relates to semiconductor devices and circuits, and more particularly, to analog, digital and mixed signal integrated circuits (ICs) that employ Super Complementary Metal-Oxide-Semiconductor (SCMOS™) devices and thereby exhibit improved device performance due to improvements in power consumption, operating speed, circuit area and device density.

BACKGROUND

Since the introduction of integrated circuits (ICs), engineers have been trying to increase the density of circuits on ICs, which reduces the cost of manufacturing of said ICs. One approach has been to put more components/functionality onto a chip. A second approach has been to build more chips on a larger wafer to reduce IC costs. For example, silicon wafer sizes have grown from averaging 3 inches in diameter in the 1960s to 12 inches today.

Various attempts were tried in the past to improve IC functionality, performance, and cost figures. Early IC implementations used bipolar junction transistors (BJTs), which have layers of various diffusion regions stacked vertically, and isolated transistor pockets containing the three switching terminals (base, emitter and collector), among other resistive (R) and capacitive (C) circuit elements. However, for the last decade of IC implementations, it was V-I signal and PHY parameter scaling that was used to house more components on a chip.

CMOS technology came after and surpassed BJT technology, which was relatively bulky, provided poor transistor yield, and exhibited high DC power usage. Device complexity has grown to over billions of circuit elements with Complementary MOS (CMOS) constructs. For more than 30 years a reduction in cost and increase in performance of CMOS technology has been achieved by shrinking the physical dimensions of CMOS transistors. These dimensions have shrunken to a size that is only a few molecular layers thick in critical device parameters. However, further shrinking of CMOS is running against limits imposed by the laws of physics. In addition to trying to manufacture tens of billions of these CMOS circuit elements with "molecular" dimensions, these dramatically smaller circuits operate with very low signal (voltage) levels, making their signal integrity susceptible to noise and causing speed degradation, and or power/heat run-off.

SUMMARY

In various embodiments, Schottky-CMOS (also referred to herein as "Super CMOS" and SCMOS™) technology is employed to build circuit blocks using Schottky Barrier diodes (SBDs), such as low threshold Schottky Barrier Diodes (LtSBD™s), thereby addressing the above deficiencies and problems associated with an increasing demand for higher semiconductor efficiency and upcoming physical limits on CMOS transistor dimensions.

In some embodiments, an integrated circuit implements a NAND gate system.

The integrated circuit includes a first input coupled to a cathode of a first p-type Schottky diode and x additional inputs coupled to x respective cathodes of x additional p-type Schottky diodes. The integrated circuit additionally includes a first n-type transistor including a gate node that is coupled to an anode of the first Schottky diode and x respective anodes of the x additional Schottky diodes. The integrated circuit additionally includes a p-type transistor including a gate node that is coupled to the anode of the first Schottky diode and x respective anodes of the x additional Schottky diodes. The integrated circuit additionally includes a second n-type transistor including a gate node that is coupled to the cathode of the first p-type Schottky diode and x additional n-type transistors including x respective gate nodes that are coupled to the x respective cathodes of the x additional p-type Schottky diodes. An output is coupled to a non-gate node of the first n-type transistor and a non-gate node of the p-type transistor.

In some embodiments, an integrated circuit implements a NOR gate system. The integrated circuit includes a first input coupled to an anode of a first n-type Schottky diode and x additional inputs coupled to x respective anodes of x additional n-type Schottky diodes. The integrated circuit additionally includes a first p-type transistor including a gate node that is coupled to a cathode of the first n-type Schottky diode and a cathode of x additional n-type Schottky diodes. The integrated circuit additionally includes an n-type transistor including a gate node that is coupled to the cathode of the first n-type Schottky diode and the cathodes of the x additional n-type Schottky diodes. The integrated circuit additionally includes a second p-type transistor including a gate node that is coupled to the anode of the first n-type Schottky diode and x additional p-type transistors including x respective gate nodes that are coupled to the x respective anodes of the x additional n-type Schottky diodes. An output is coupled to a non-gate node of the first p-type transistor and a non-gate node of the n-type transistor.

In some embodiments, an integrated circuit implements an x-input logic gate. The integrated circuit includes a plurality of Schottky diodes that includes x Schottky diodes and a plurality of source-follower transistors that includes x source-follower transistors. Each respective source-follower transistor of the plurality of source-follower transistors includes a respective gate node that is coupled to a respective Schottky diode. A first source-follower transistor of the plurality of source-follower transistors is connected serially to a second source-follower transistor of the plurality of source-follower transistors.

Various advantages of the disclosed technology will be apparent in light of the descriptions below.

BRIEF DESCRIPTION OF THE DRAWINGS

The aforementioned features and advantages of the disclosure as well as additional features and advantages thereof will be more clearly understood hereinafter as a result of a detailed description of preferred embodiments when taken in conjunction with the drawings.

To illustrate the technical solutions according to the embodiments of the present disclosure more clearly, the accompanying drawings needed for the embodiments are introduced briefly below. The appended drawings, however, merely illustrate the more pertinent features of the present disclosure and are therefore not to be considered limiting, for the description may admit to other effective features.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the subject matter presented herein. But it will be apparent to one skilled in the art that the subject matter may be practiced or designed without these specific details. In other instances, well-known methods, procedures, components, and circuits have not been described in detail so as not to unnecessarily obscure aspects of the embodiments. Trademarks designated herein with the "TM" symbol are the property of Schottky LSI, Inc.

The technical solution of the present disclosure will be clearly and completely described in the following with reference to the accompanying drawings. It is obvious that the embodiments to be described are examples and only a part rather than all of the embodiments of the present disclosure. All other embodiments obtained by persons skilled in the art based on the described embodiments of the present disclosure shall fall within the protection scope of the present disclosure.

The Schottky-CMOS technology described herein implements logic using a Schottky Barrier diode (also referred to herein as "SBD" and "Schottky diode"). In comparison with prior CMOS implementations, various embodiments of the Schottky-CMOS described herein use Schottky diodes in lieu of p-type metal-oxide-semiconductor (PMOS) field effect transistors and/or n-type metal-oxide-semiconductor (NMOS) field effect transistors. Particularly as the number of logic inputs to a logic gate increases, replacing PMOS and NMOS transistors with Schottky diodes increases the efficiency of the implemented logic in various ways, including reduced area consumed by the circuit layout, reduced propagation delay, and reduced power required for switching.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
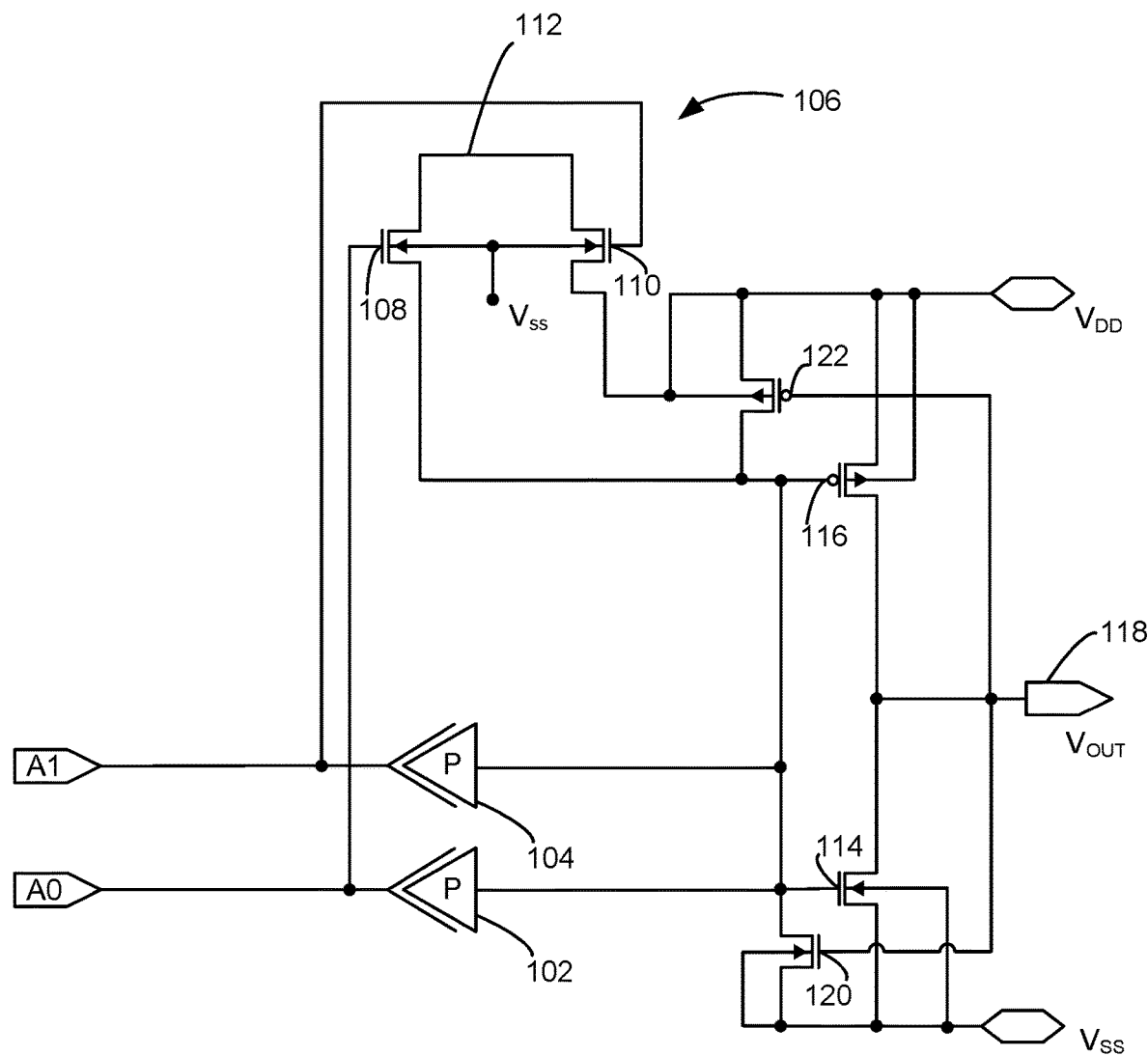
FIG. 1 is a circuit diagram of a two-input Schottky-CMOS NAND gate, in accordance with some embodiments.

FIG. 1 is a circuit diagram of a two-input Schottky-CMOS NAND gate, in accordance with some embodiments. The two-input Schottky-CMOS NAND gate includes two p-type Schottky diodes 102 and 104 and a source follower tree 106 that includes two n-type transistors 108 and 110. The transistors in the source follower tree 106 are connected in series, as indicated by the connection 112. Input A0 is coupled to a cathode of p-type Schottky barrier diode (SBD) 102 and to a gate node of n-type transistor 108. Input A1 is coupled to a cathode of p-type SBD 104 and a gate node of n-type transistor 110. An anode of SBD 102 and an anode of SBD 104 are coupled to the gates of result transistors 114 and 116. Result transistor 114 is an n-type transistor and result transistor 116 is a p-type transistor. Output 118 is coupled to non-gate nodes of the result transistors 114 and 116. Specifically, output 118 is coupled to the drain node of n-type transistor 114 and output 118 is coupled to the drain node of p-type transistor 116.

In some embodiments, the two-input Schottky-CMOS NAND gate includes feedback logic that receives the output signal as an input at gate nodes of n-type transistor 120 and p-type transistor 122.

Whereas a CMOS implementation of a two-input NAND gate would use a p-type transistor and an n-type transistor coupled to each input of the NAND gate, in some embodiments, the Schottky-CMOS implementation of the two-input NAND gate uses a p-type SBD and an n-type transistor coupled to each input (replacing a p-type transistor of the CMOS implementation with a p-type SBD in the Schottky-CMOS implementation). As the number of inputs in the NAND gate increases, the efficiencies attained by replacing transistors with SBDs increases, e.g., as illustrated by the CMOS and Schottky-CMOS performance comparisons of FIGS. 9-11.

Figure 2:
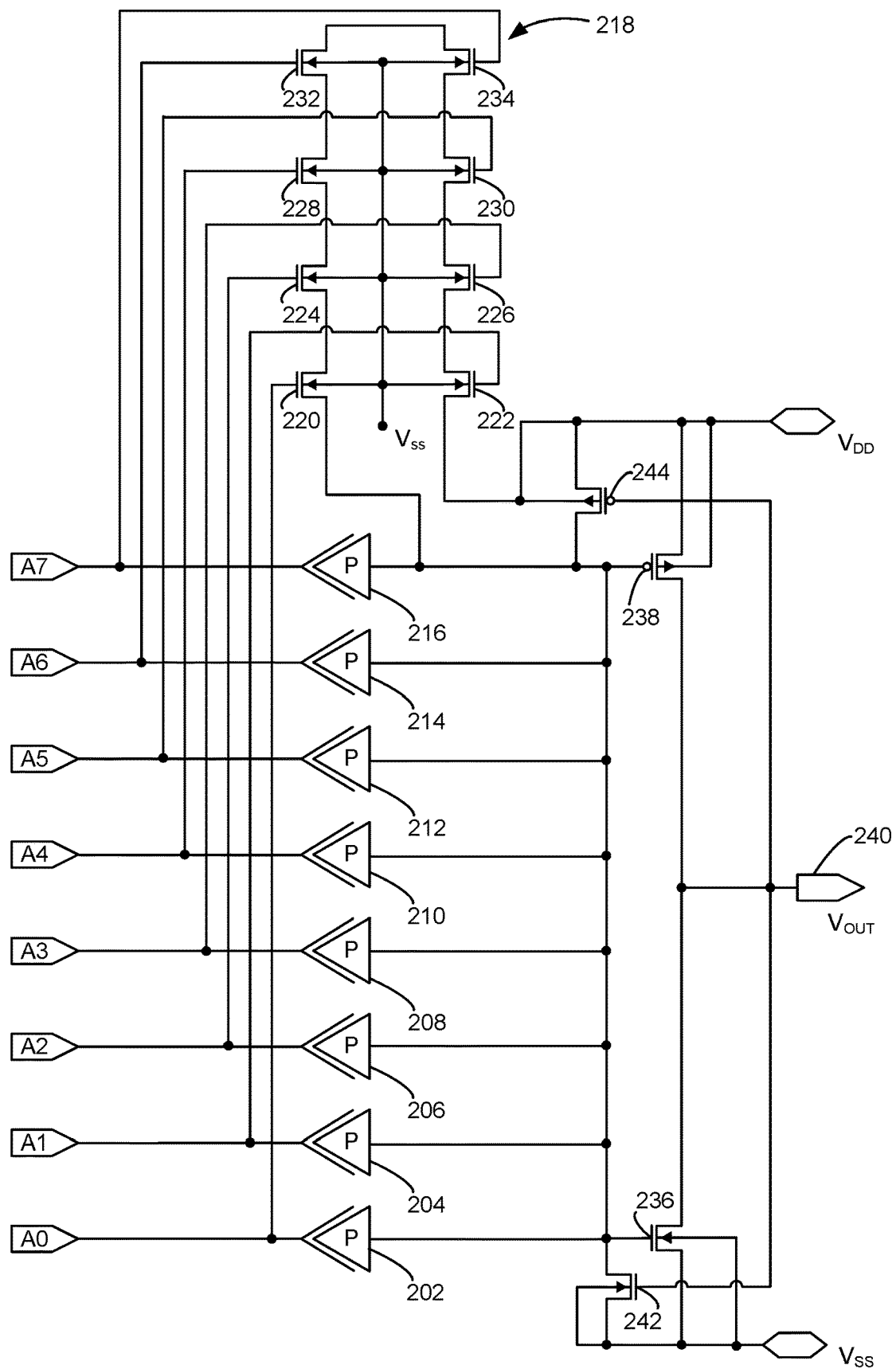
FIG. 2 is a circuit diagram of an eight-input Schottky-CMOS NAND gate, in accordance with some embodiments.

FIG. 2 is a circuit diagram of an eight-input Schottky-CMOS NAND gate, in accordance with some embodiments. The eight-input Schottky-CMOS NAND gate includes eight p-type Schottky diodes, 202-216 and a source follower tree 218 that includes eight n-type transistors 220-234. Transistors 220-234 in the source follower tree 218 are connected in series (e.g., the drain node of transistor 220 is coupled to the source node of transistor 224, the drain node of transistor 224 is coupled to the source node of transistor 228, and so on). Input A0 is coupled to a cathode of p-type SBD 202 and to a gate node of n-type transistor 220. Input A1 is coupled to a cathode of p-type SBD 204 and a gate node of n-type transistor 222. Input A2 is coupled to a cathode of p-type SBD 206 and to a gate node of n-type transistor 224. Input A3 is coupled to a cathode of p-type SBD 208 and a gate node of n-type transistor 226. Input A4 is coupled to a cathode of p-type SBD 210 and to a gate node of n-type transistor 228. Input A5 is coupled to a cathode of p-type SBD 212 and a gate node of n-type transistor 230. Input A6 is coupled to a cathode of p-type SBD 214 and to a gate node of n-type transistor 232. Input A7 is coupled to a cathode of p-type SBD 216 and a gate node of n-type transistor 234.

Anodes of SBDs 202-216 are coupled to the gates of result transistors 236 and 238. Result transistor 236 is an n-type transistor and result transistor 238 is a p-type transistor. Output 240 is coupled to non-gate nodes of the result transistors 236 and 238. Specifically, output 240 is coupled to the drain node of n-type transistor 236 and output 240 is coupled to the drain node of p-type transistor 238.

In some embodiments, the eight-input Schottky-CMOS NAND gate includes feedback logic that receives the output signal as an input at gate nodes of n-type transistor 242 and p-type transistor 244.

It will be recognized that the scaling illustrated with regard to FIGS. 1-2 can be extended to other numbers of NAND gate inputs. For each additional input, an additional SBD is coupled to the additional input, and an additional source-follower transistor that is complementary to the SBD (e.g., an n-type transistor complementary to a p-type SBD) is added to the source follower tree (e.g., as illustrated by source-follower tree 106 of FIG. 1 or source-follower tree 218 of FIG. 2). The additional input is coupled to the additional SBD (e.g., to the cathode of a p-type SBD) and to the gate node of the additional source-follower transistor. The additional SBD is coupled (e.g., the anode of a p-type SBD) to the gate nodes of a set of result transistors (e.g., as illustrated by result transistors 114-116 of FIG. 1 or result transistors 236-238 of FIG. 2).

For example, a four-input Schottky-CMOS NAND gate includes four inputs A0-A3, four p-type SBDs (e.g., configured as illustrated by SBDs 202-208 of FIG. 2) and four n-type transistors (e.g., transistors as illustrated at 220, 222, 224, and 226 of FIG. 2 connected in series).

In some embodiments, a Schottky-CMOS NAND gate includes a number of inputs between two inputs and sixteen inputs, such as twelve inputs.

Figure 3:
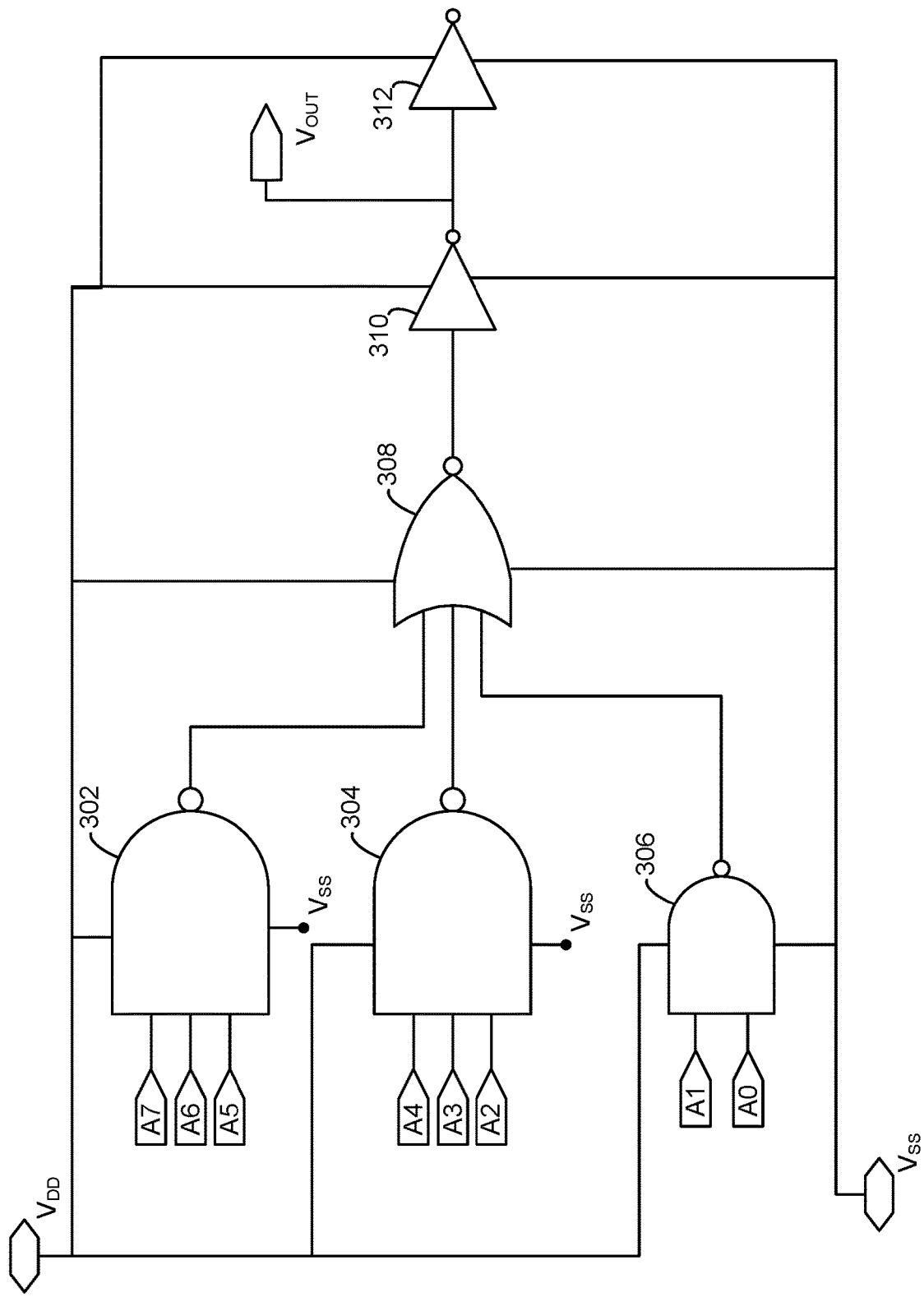
FIG. 3 is a circuit diagram of an 8-input CMOS NAND gate.

FIG. 3 is a circuit diagram of an 8-input CMOS NAND gate. The CMOS 8-input NAND gate requires three NAND gates 302, 304, and 306, a NOR gate 308, and inverters 310 and 312. In comparison with the Schottky-CMOS eight-input NAND gate described with regard to FIG. 2, the stacked configuration of the NAND gates 302-306 that feed into NOR gate 308, as shown in FIG. 3, requires increased power and increased supply current, and causes an increased layout area, increased switching time, and increased propagation delay (as described further below with regard to FIGS. 9-12).

Figure 4:
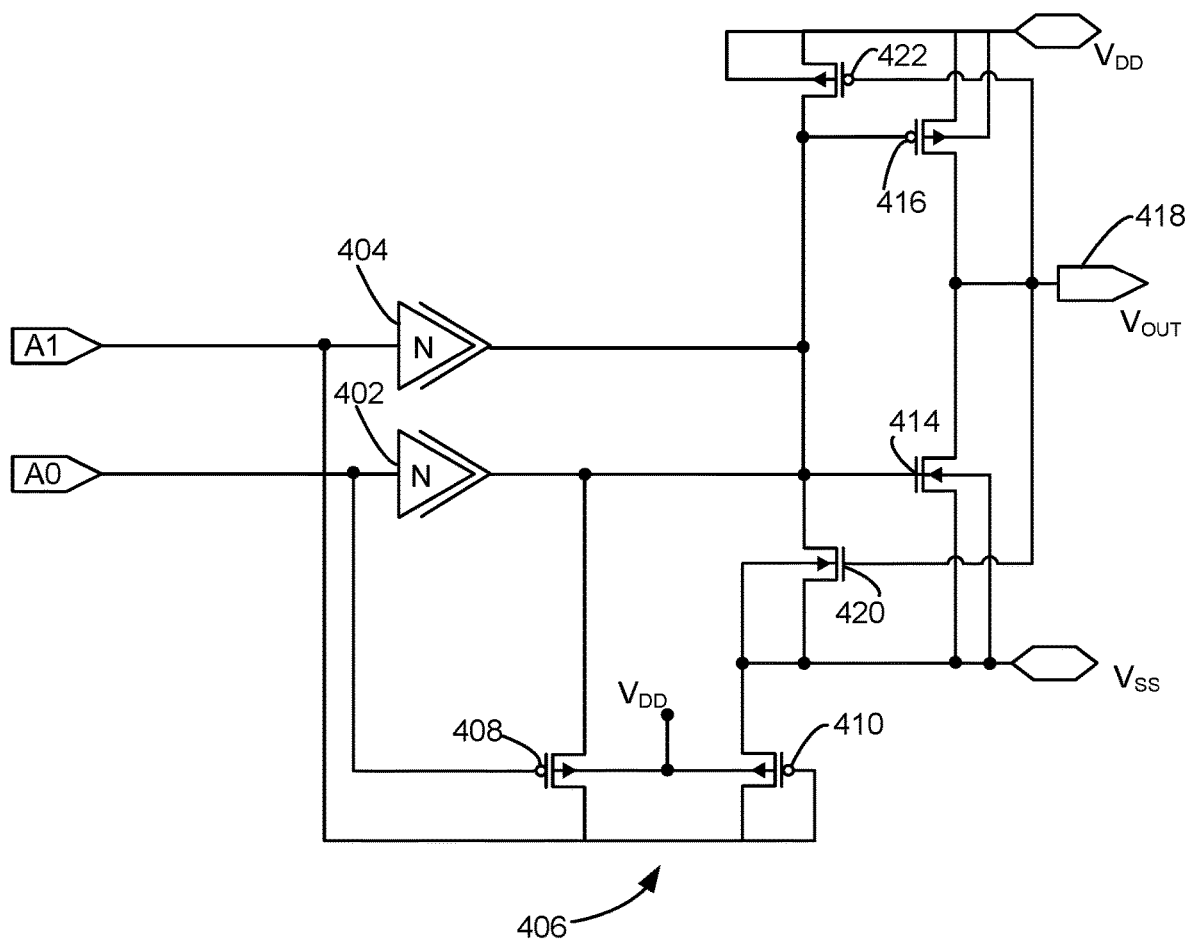
FIG. 4 is a circuit diagram of a two-input Schottky-CMOS NOR gate, in accordance with some embodiments.

FIG. 4 is a circuit diagram of a two-input Schottky-CMOS NOR gate, in accordance with some embodiments. The two-input Schottky-CMOS NOR gate includes two n-type Schottky diodes 402 and 404 and a source follower tree 406 that includes two p-type transistors 408 and 410. The transistors in the source follower tree 406 are connected in series. Input A0 is coupled to an anode of n-type Schottky barrier diode (SBD) 402 and to a gate node of p-type transistor 408. Input A1 is coupled to an anode of n-type SBD 404 and a gate node of p-type transistor 410. A cathode of SBD 402 and a cathode of SBD 404 are coupled to the gates of result transistors 414 and 416. Result transistor 414 is an n-type transistor and result transistor 416 is a p-type transistor. Output 418 is coupled to non-gate nodes of the result transistors 414 and 416. Specifically, output 418 is coupled to the drain node of n-type transistor 414 and output 118 is coupled to the drain node of p-type transistor 416.

In some embodiments, the two-input Schottky-CMOS NOR gate includes feedback logic that receives the output signal as an input at gate nodes of n-type transistor 420 and p-type transistor 422.

Whereas a CMOS implementation of a two-input NOR gate would use a p-type transistor and an n-type transistor coupled to each input of the NOR gate, in some embodiments, the Schottky-CMOS implementation of the two-input NOR gate uses a n-type SBD and a p-type transistor coupled to each input (replacing an n-type transistor of the prior CMOS implementation with an n-type SBD in the Schottky-CMOS implementation). As the number of inputs in the NOR gate increases, the efficiencies attained by replacing transistors with SBDs increases.

Figure 5:
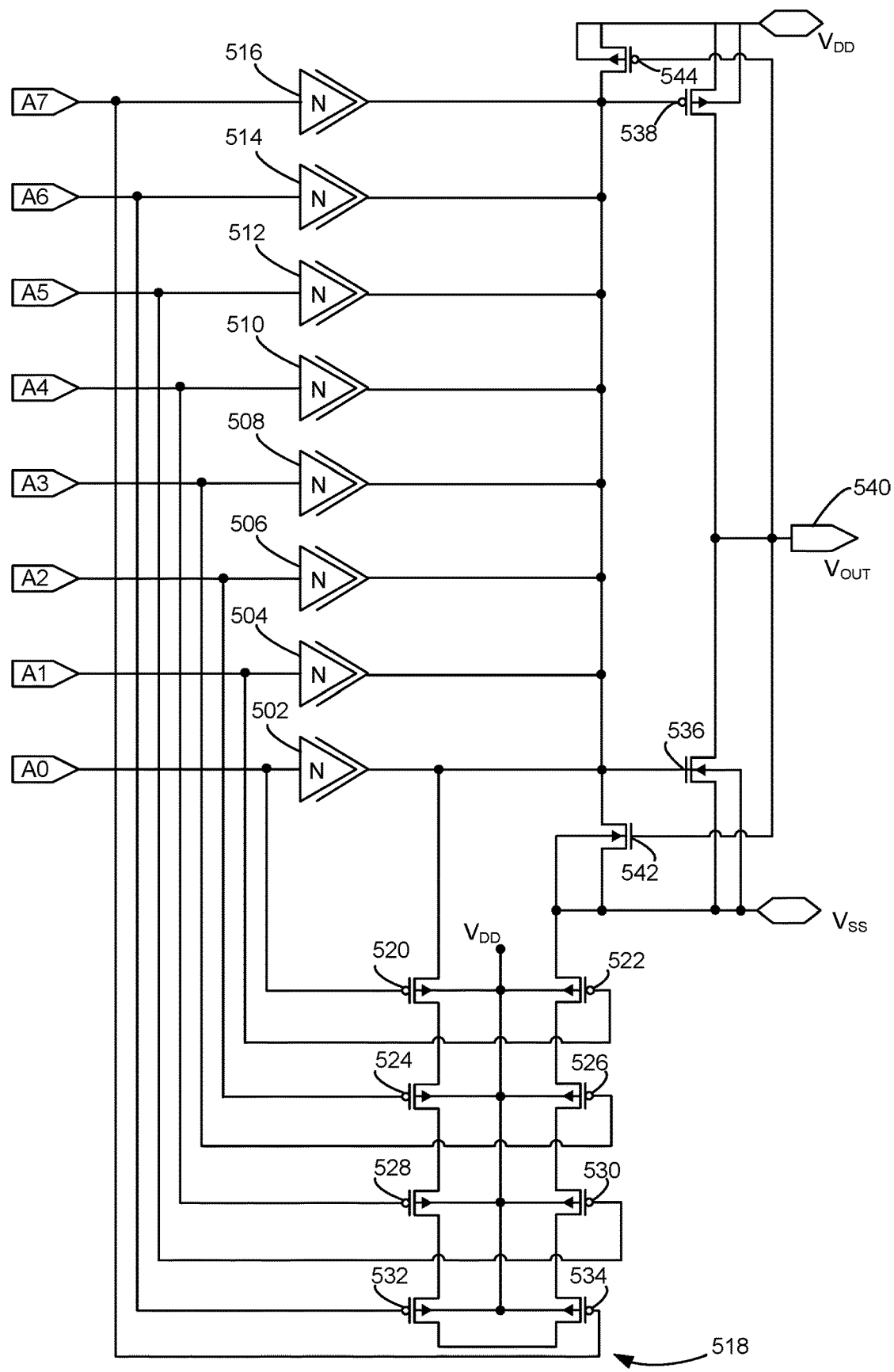
FIG. 5 is a circuit diagram of an eight-input Schottky-CMOS NOR gate, in accordance with some embodiments.

FIG. 5 is a circuit diagram of an eight-input Schottky-CMOS NOR gate, in accordance with some embodiments. The eight-input Schottky-CMOS NOR gate includes eight n-type Schottky diodes, 502-516 and a source follower tree 518 that includes eight n-type transistors 520-534. Transistors 520-534 in the source follower tree 518 are connected in series (e.g., the drain node of transistor 520 is coupled to the source node of transistor 524, the drain node of transistor 524 is coupled to the source node of transistor 528, and so on). Input A0 is coupled to an anode of n-type SBD 502 and to a gate node of p-type transistor 520. Input A1 is coupled to an anode of n-type SBD 504 and a gate node of p-type transistor 522. Input A2 is coupled to an anode of n-type SBD 506 and to a gate node of p-type transistor 524. Input A3 is coupled to an anode of n-type SBD 508 and a gate node of p-type transistor 526. Input A4 is coupled to an anode of n-type SBD 510 and to a gate node of p-type transistor 528. Input A5 is coupled to an anode of n-type SBD 512 and a gate node of p-type transistor 530. Input A6 is coupled to an anode of n-type SBD 514 and to a gate node of p-type transistor 532. Input A7 is coupled to an anode of n-type SBD 516 and a gate node of p-type transistor 534.

Cathodes of SBDs 502-516 are coupled to the gates of result transistors 536 and 538. Result transistor 536 is an n-type transistor and result transistor 538 is a p-type transistor. Output 540 is coupled to non-gate nodes of the result transistors 536 and 538. Specifically, output 540 is coupled to the drain node of n-type transistor 536 and output 540 is coupled to the drain node of p-type transistor 538.

In some embodiments, the eight-input Schottky-CMOS NOR gate includes feedback logic that receives the output signal as an input at gate nodes of n-type transistor 542 and p-type transistor 544.

It will be recognized that the scaling illustrated with regard to FIGS. 4-5 can be extended to other numbers of NOR gate inputs. For each additional input, an additional SBD is coupled to the additional input, and an additional source-follower transistor that is complementary to the SBD (e.g., a p-type transistor complementary to an n-type SBD) is added to the source follower tree (e.g., as illustrated by source-follower tree 406 of FIG. 4 or source-follower tree 518 of FIG. 5). The additional input is coupled to the additional SBD (e.g., to the cathode of an n-type SBD) and to the gate node of the additional source-follower transistor. The additional SBD is coupled (e.g., the anode of a p-type SBD) to the gate nodes of a set of result transistors (e.g., as illustrated by result transistors 414-416 of FIG. 4 or result transistors 536-538 of FIG. 5).

For example, a four-input Schottky-CMOS NOR gate includes four inputs A0-A3, four n-type SBDs (e.g., configured as illustrated by SBDs 502-508 of FIG. 5) and four p-type transistors (e.g., transistors as illustrated at 520, 522, 524, and 526 of FIG. 5 connected in series).

In some embodiments, a Schottky-CMOS NOR gate includes a number of inputs between two inputs and sixteen inputs, such as twelve inputs.

Figure 6:
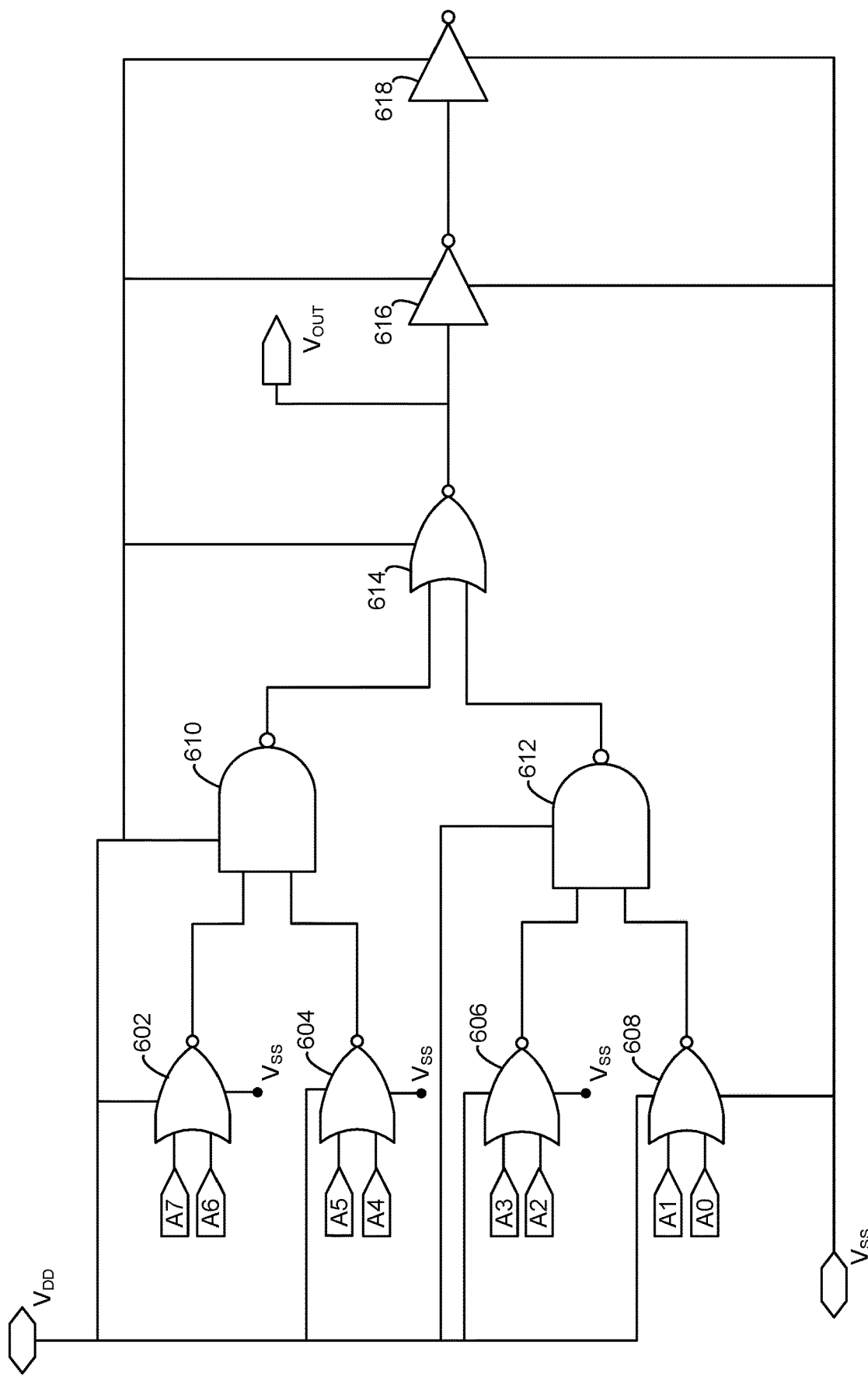
FIG. 6 is a circuit diagram of an 8-input CMOS NOR gate.

FIG. 6 is a circuit diagram of an 8-input CMOS NOR gate. The CMOS 8-input NOR gate requires four two-input NAND gates 602, 604, 606, and 608, two two-input NAND gates 610 and 612, two-input NOR gate 614, and inverters 616 and 618. In comparison with the Schottky-CMOS eight-input NOR gate described with regard to FIG. 5, the stacked configuration of the NOR gates 602-608 that feed into NAND gates 610 and 612, that in turn feed into NOR gate 614, as shown in FIG. 6, requires increased power and increased supply current, and causes an increased layout area, increased switching time, and increased propagation delay.

Figure 7:
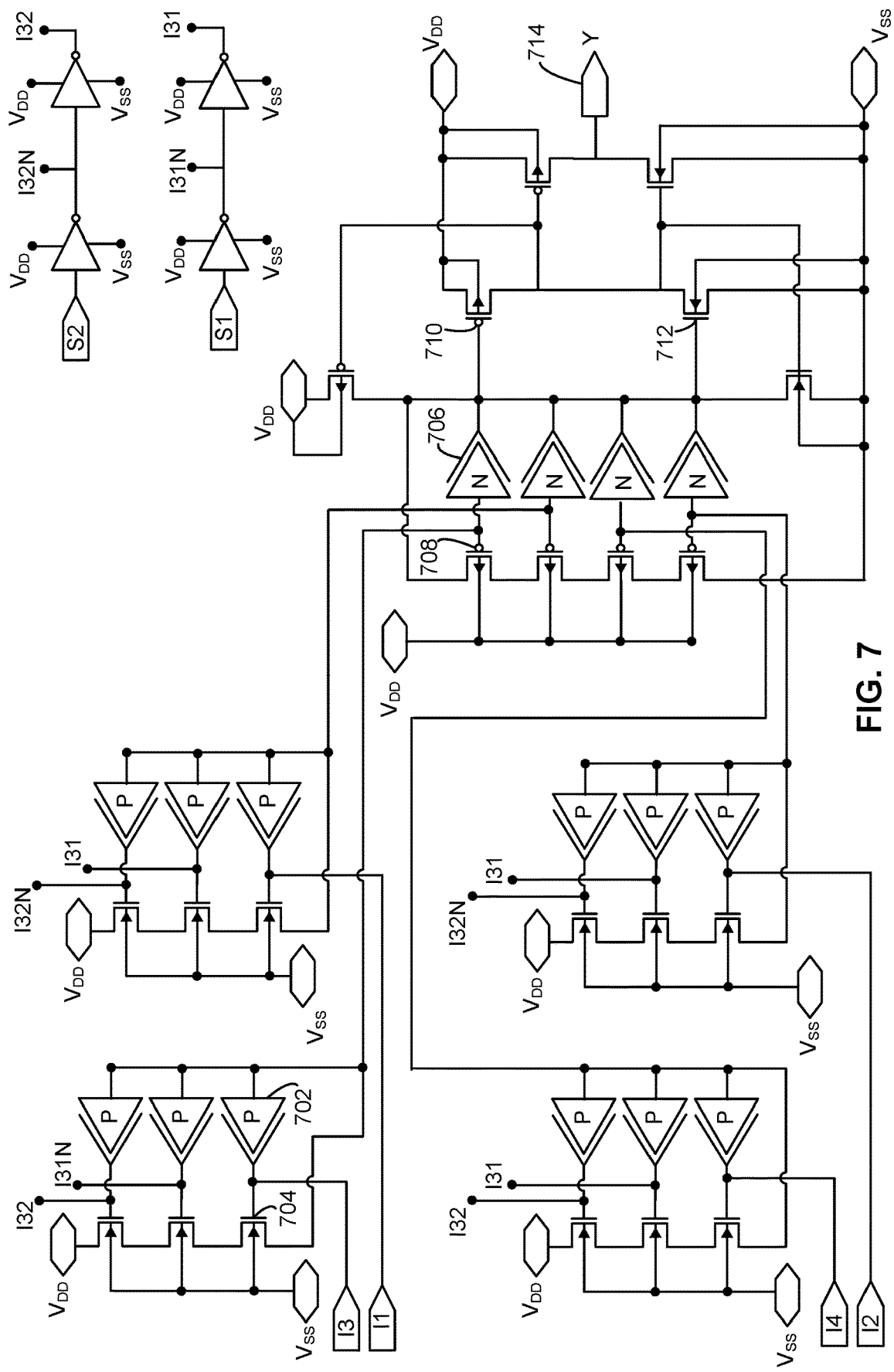
FIG. 7 is a circuit diagram of a Schottky-CMOS implementation of a 4-to-1 multiplexer circuit, in accordance with some embodiments.

FIG. 7 is a circuit diagram of a Schottky-CMOS implementation of a 4-to-1 multiplexer circuit (MUX), in accordance with some embodiments. The Schottky-CMOS MUX couples input I1 to a p-type SBD 702 and a gate node of an n-type transistor 704. Inputs I2, I3, and I4 are similarly each coupled to a p-type SBD and a gate node of an n-type transistor. The output of the p-type SBD 702 and transistor 704 is coupled to n-type SBD 706 and a p-type transistor 708. The outputs of the SBDs and transistors that receive input from I2, I3, and I4 are similarly each coupled to an n-type SBD and a p-type transistor. The outputs of the n-type SBDs are coupled to a gate node of a p-type result transistor 710 and a gate node of an n-type result transistor 712. The output of the result transistors is received by output 714.

Figure 8:
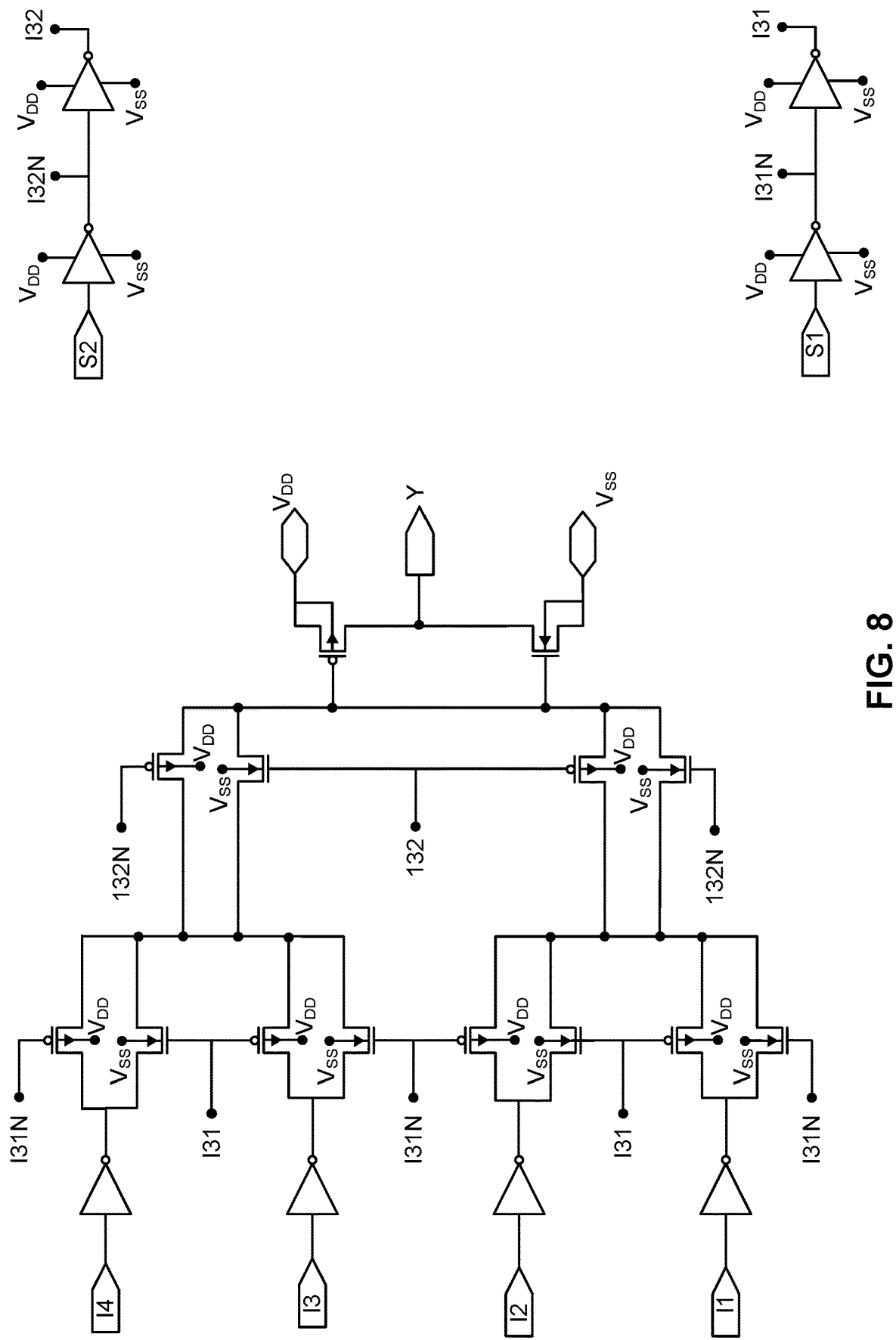
FIG. 8 illustrates a CMOS implementation of a 4-to-1 multiplexer circuit.

FIG. 8 illustrates a CMOS implementation of a 4-to-1 multiplexer circuit.

In some embodiments, the Schottky-CMOS logic described with regard to FIG. 1, FIG. 2, FIG. 4, FIG. 5 and/or FIG. 7 is configured for asynchronous (e.g., static) operation. For example, a size of one or more components is selected such that the operation of the circuit is asynchronous or substantially asynchronous. In some embodiments, a size of one or more components of Schottky-CMOS logic is selected to reduce and/or minimize switching noise immunity.

In some embodiments, one or more SBDs of the Schottky-CMOS logic described with regard to FIG. 1, FIG. 2, FIG. 4, FIG. 5 and/or FIG. 7 has a threshold forward voltage that is lower than the threshold forward voltage of a transistor that has a gate coupled to the SBD (e.g., wherein both the transistor and the SBD are coupled to an input of the gate). For example, referring to FIG. 1, in some embodiments, SBD 102 has a threshold forward voltage that is lower than the threshold forward voltage of transistor 108 and/or SBD 104 has a threshold forward voltage that is lower than the threshold forward voltage of transistor 110. Referring to FIG. 2, in some embodiments, SBD 202 has a threshold forward voltage that is lower than the threshold forward voltage of transistor 220, SBD 204 has a threshold forward voltage that is lower than the threshold forward voltage of transistor 222, and/or SBD 206 has a threshold forward voltage that is lower than the threshold forward voltage of transistor 224, and so on. Referring to FIG. 4, in some embodiments, SBD 402 has a threshold forward voltage that is lower than the threshold forward voltage of transistor 408 and/or SBD 404 has a threshold forward voltage that is lower than the threshold forward voltage of transistor 410. Referring to FIG. 5, in some embodiments, SBD 502 has a threshold forward voltage that is lower than the threshold forward voltage of transistor 520, SBD 504 has a threshold forward voltage that is lower than the threshold forward voltage of transistor 522, and/or SBD 506 has a threshold forward voltage that is lower than the threshold forward voltage of transistor 524, and so on. Referring to FIG. 7, in some embodiments, SBD 702 has a threshold forward voltage that is lower than the threshold forward voltage of transistor 704.

Figure 9:
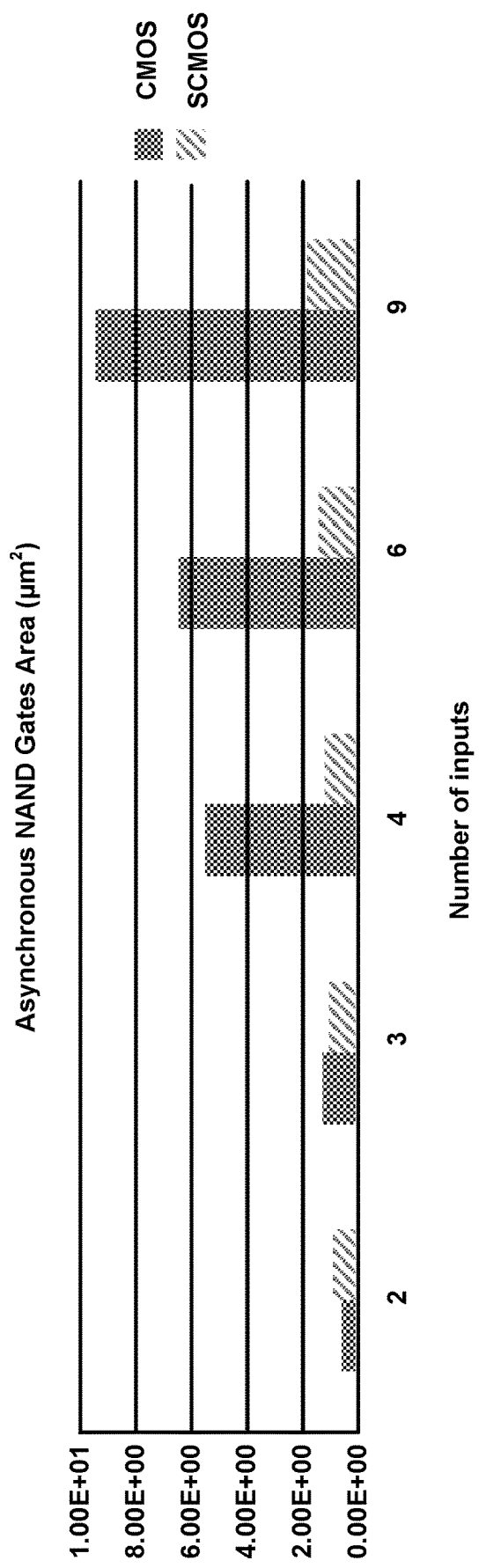
FIG. 9 is a chart that compares layout areas of NAND gates implemented using Schottky-CMOS with layout areas of NAND gates implemented using CMOS, in accordance with some embodiments.

FIG. 9 is a chart that compares layout areas of NAND gates implemented using Schottky-CMOS (e.g., as shown in FIGS. 1-2) with layout areas of NAND gates implemented using CMOS (e.g., as shown in FIG. 3), in accordance with some embodiments. As can be seen from FIG. 9, compared with the increase in the area of CMOS NAND gates as the number of inputs increase, the area of Schottky-CMOS NAND gates increases at a lower rate. FIG. 9 indicates that a required layout area for a four-input Schottky-CMOS NAND gate is less than 2.0 $\mu m^2$, which is significantly less than the area required for a four-input CMOS NAND gate. The reduction in area required for Schottky-CMOS NAND gates with three or more inputs in comparison with CMOS NAND gates with the same number of inputs is caused by, e.g., a reduced number of signal lines and/or circuit nets required to implement the logic, and the relatively small size of a source-follower tree (e.g., as shown at 106, 218, 406, and 518) in comparison with the layouts of CMOS NAND gates (e.g., as shown at FIG. 3 and FIG. 6).

Figure 10:
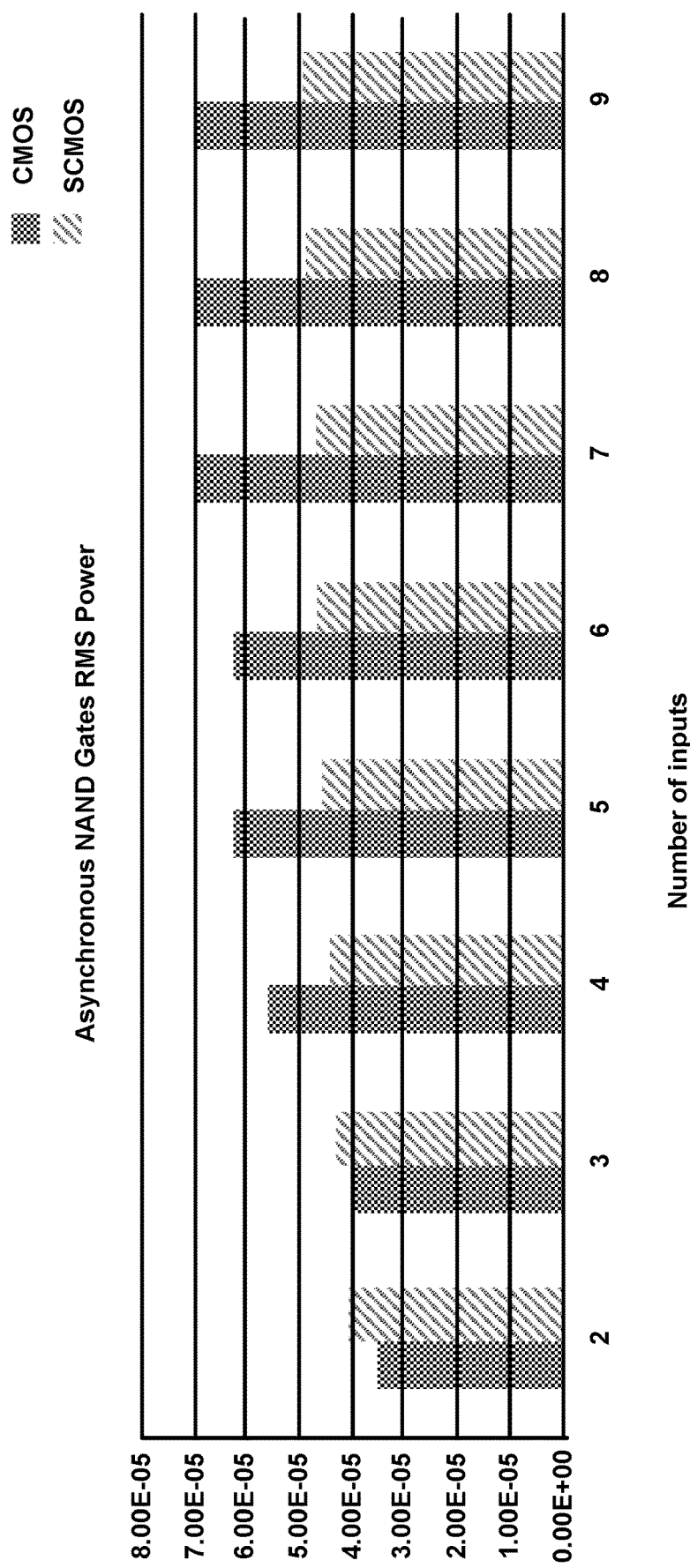
FIG. 10 is a chart that compares a root mean square (RMS) power draw for NAND gates implemented using Schottky-CMOS with the power draw of NAND gates implemented using CMOS, in accordance with some embodiments.

FIG. 10 is a chart that compares a root mean square (RMS) power draw for NAND gates implemented using Schottky-CMOS (e.g., as shown in FIGS. 1-2) with the power draw of NAND gates implemented using CMOS (e.g., as shown in FIG. 3), in accordance with some embodiments. As can be seen from FIG. 10, compared with the increase in the power required for CMOS NAND gates as the number of inputs increase, the power required for Schottky-CMOS NAND gates increases at a lower rate. FIG. 10 indicates that the RMS power requirement for a four-input Schottky-CMOS NAND gate is less than 50.0 microwatts, which is significantly less than the power required for a four-input CMOS NAND gate.

Figure 11:
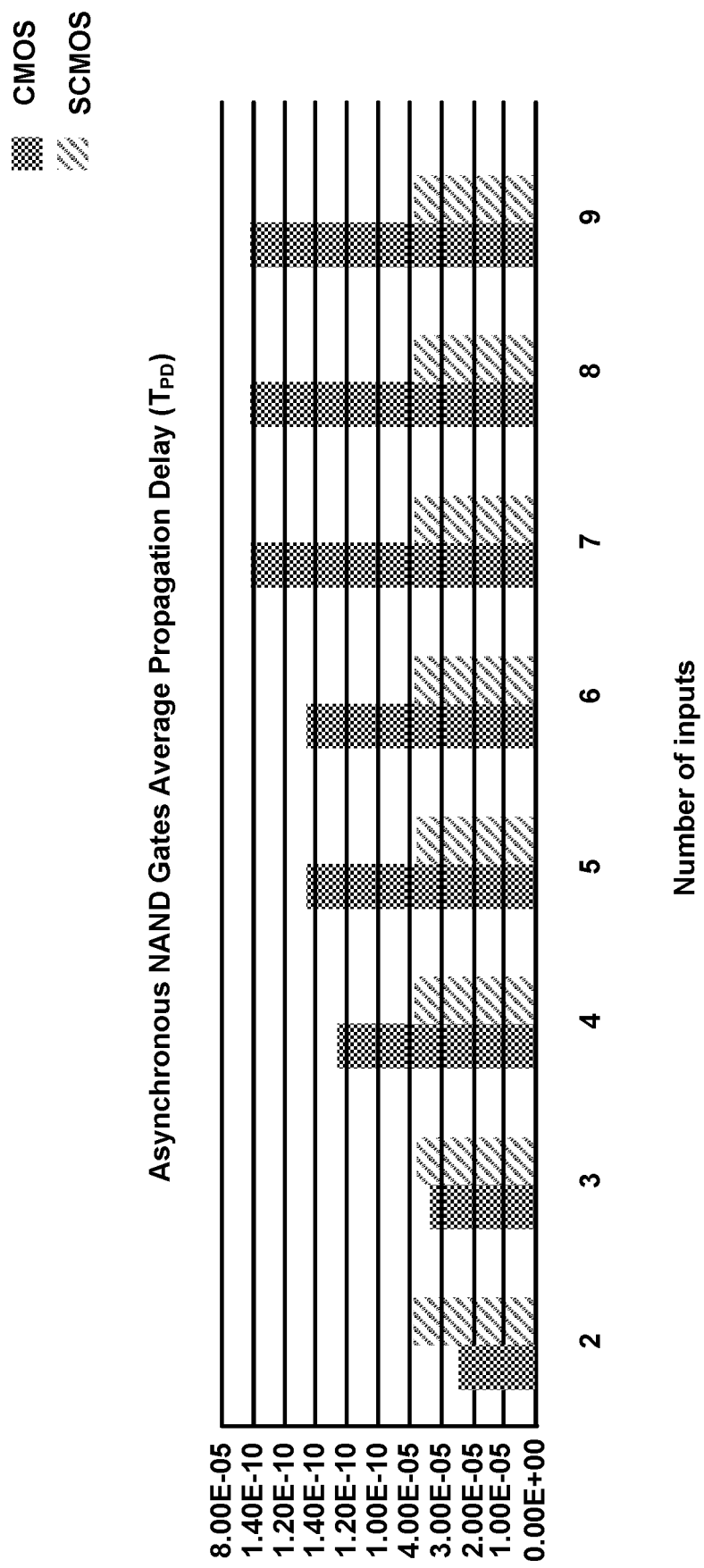
FIG. 11 is a chart that compares propagation delay of NAND gates implemented using Schottky-CMOS with propagation delay of NAND gates implemented using CMOS, in accordance with some embodiments.

FIG. 11 is a chart that compares propagation delay of NAND gates implemented using Schottky-CMOS (e.g., as shown in FIGS. 1-2) with propagation delay of NAND gates implemented using CMOS (e.g., as shown in FIG. 3), in accordance with some embodiments. FIG. 11 indicates that a four-input Schottky-CMOS NAND gate has a propagation delay of less than 80 picoseconds, which is significantly less than the propagation delay of a four-input CMOS NAND gate.

As can be seen from FIG. 11, the propagation delay of CMOS NAND gates exhibits particularly pronounced increases as the number of inputs increases from three inputs to four inputs and from six inputs to seven inputs. The pronounced increases in required area, power draw, and propagation delay that occur in CMOS implementations of NAND gates as the number of inputs increases can be understood with reference to FIGS. 12A-12G.

FIGS. 12A-12G illustrate CMOS implementations of NAND gates that have various numbers of inputs.

Figure 12E:
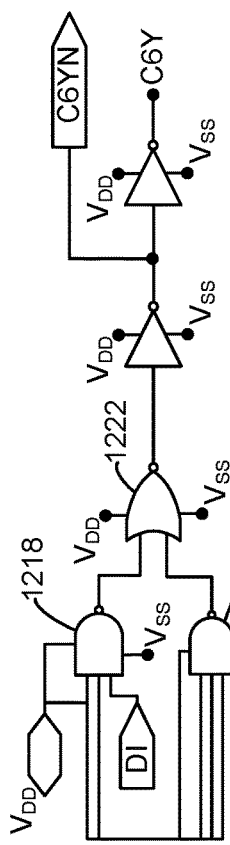
FIGS. 12A-12G illustrate CMOS implementations of NAND gates that have various numbers of inputs.
Figure 12F:
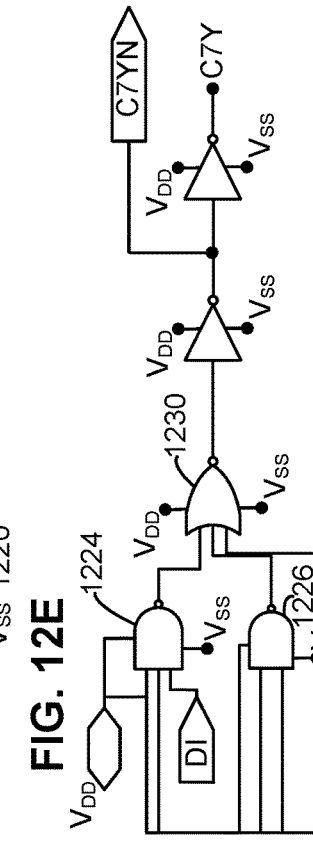
Figure 12G:
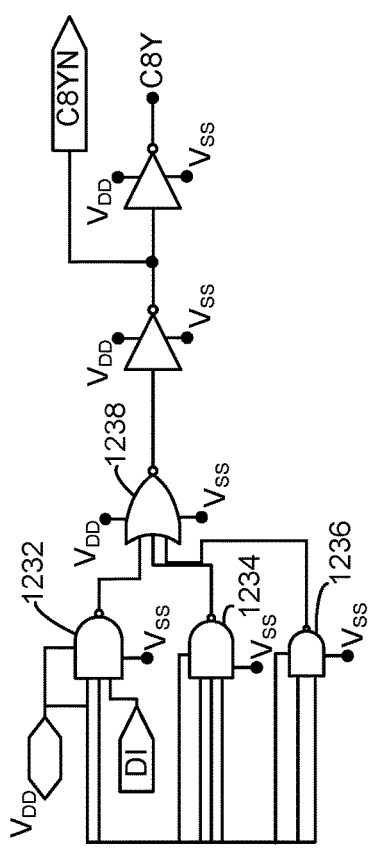
Figure 12A:
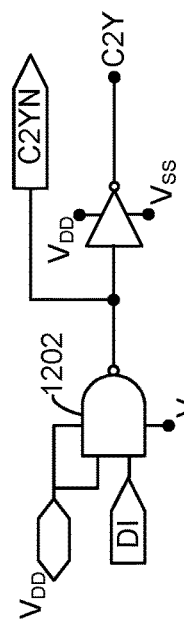
Figure 12B:
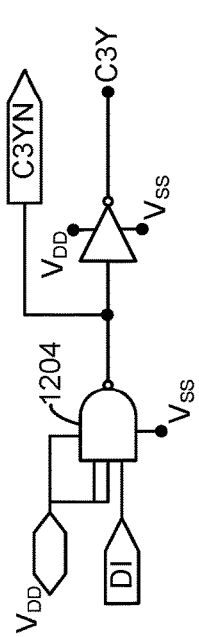

FIG. 12A illustrates two-input NAND logic implemented using a single two-input NAND gate 1202. FIG. 12B illustrates three-input NAND logic implemented using a single three-input NAND gate 1204.

Figure 12C:
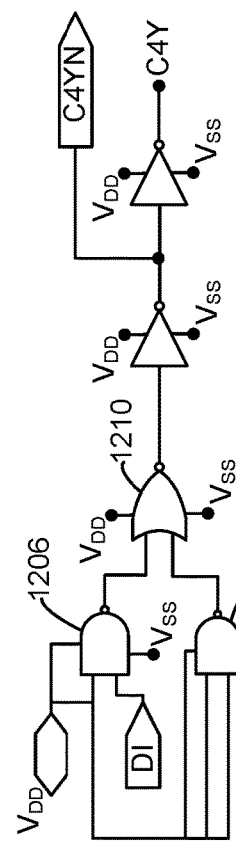

FIG. 12C illustrates four-input NAND logic implemented using two NAND gates 1206 and 108 and a NOR gate 1210. When the number of NAND inputs increases from three inputs, as shown in FIG. 12B, to four inputs, as shown in FIG. 12C, the use of two NAND gates 1206 and 1208 (rather than the single NAND gate 1204 of FIG. 12B) and the addition of NOR gate 1210 increases the propagation delay through the circuit. This increase is reflected in the jump in propagation delay from less than 80 picoseconds for a three-input CMOS NAND to a propagation delay of more than 120 picoseconds for a four-input CMOS NAND, as shown in FIG. 11.

Figure 12D:
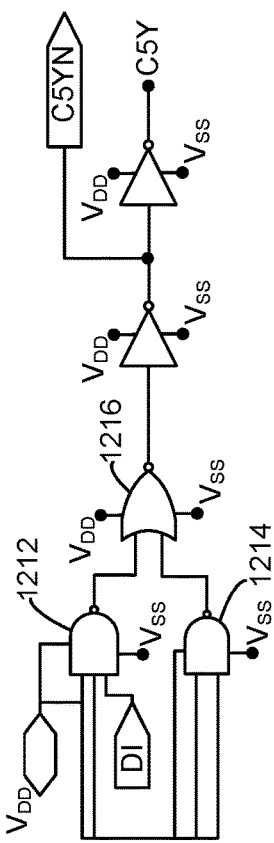

FIGS. 12D-12E illustrate five-input and six-input CMOS NAND gates, respectively. Like the four-input CMOS NAND shown in FIG. 12C, the five-input and six-input CMOS NAND gates feed the output of two NAND gates to a NOR gate. The CMOS NAND gate of FIG. 12D feeds the outputs of NAND gates 1212 and 1214 to NOR gate 1216. The CMOS NAND gate of FIG. 12E feeds the outputs of NAND gates 1218 and 1220 to NOR gate 1222.

FIG. 12F illustrates seven-input NAND logic implemented using three NAND gates 1224, 1226, and 1228 and a NOR gate 1230. When the number of NAND inputs increases from six inputs, as shown in FIG. 12E, to seven inputs, as shown in FIG. 12F, the use of three NAND gates (1224, 1226, and 1228), rather than the two NAND gates (1218, 1220) of FIG. 12E, increases the propagation delay through the circuit. This increase is reflected in the jump in propagation delay from less than 140 picoseconds for a six-input CMOS NAND to a propagation delay of nearly 180 picoseconds for a seven-input CMOS NAND, as shown in FIG. 11.

FIG. 12G illustrates an eight-input CMOS NAND gate, which has a similar circuit structure to the eight input CMOS NAND gate described with regard to FIG. 3. The CMOS NAND gate of FIG. 12G feeds the output of NAND gates 1232, 1234, and 1236 to NOR gate 1238.

As described above with regard to the CMOS NAND gates of FIGS. 12A-12G, increasing the number of inputs of CMOS NAND gate requires increasing a number of NAND gates and/or adding a NOR stage. In some embodiments (e.g., as described with regard to FIGS. 1-2 and FIGS. 4-5), increasing the number of inputs of a Schottky-CMOS NAND gate includes increasing a number of SBDs and increasing a number of corresponding transistors in a source follower tree. In some embodiments, compared with CMOS approaches, the Schottky-CMOS approaches described herein result in lower increases in power draw, layout area, and propagation delay as a number of logic inputs increases.

While particular embodiments are described above, it will be understood it is not intended to limit the disclosure to these particular embodiments. On the contrary, the disclosure includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

The terminology used in the description of the disclosure herein is for the purpose of describing particular embodiments only and is not intended to be limiting of the disclosure. As used in the description of the disclosure and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

What is claimed is:

1. An integrated circuit implementing a Schottky-CMOS multiplexer (MUX) gate system, the integrated circuit comprising:
   a first input coupled to a cathode of a first Schottky diode and a gate node of a first N-type transistor;
   x additional inputs coupled to x respective cathodes of a first set of Schottky diodes and x respective gate nodes of x additional N-type transistors, wherein x is an integer number;
   an output of the first Schottky diode is coupled to an anode of a second Schottky diode and a gate node of a first P-type transistor;
   x outputs of the first set of Schottky diodes coupled to x respective anodes of a second set of Schottky diodes and x respective gate nodes of x additional P-type transistors;
   an output of the second Schottky diode is coupled to respective gate nodes of a second N-type transistor and a second P-type transistor; and
   x outputs of the second set of Schottky diodes coupled to the respective gate nodes of the second N-type transistor and the second P-type transistor, the output of the second N-type transistor and the second P-type transistor is coupled to an output of the MUX gate system.

2. The integrated circuit of claim 1, wherein the second P-type transistor and the second n-type transistor are a CMOS inverter.

3. The integrated circuit of claim 2, wherein the CMOS inverter is biased between a high voltage supply and a low voltage supply.

4. The integrated circuit of claim 1, wherein a threshold forward voltage of the second Schottky diode is less than a threshold voltage of the second N-type transistor.

5. The integrated circuit of claim 1, wherein a threshold forward voltage of the second Schottky diode is less than a threshold voltage of the second P-type transistor.

6. The integrated circuit of claim 1, wherein respective threshold forward voltages of the first Schottky diode and the first set of Schottky diodes are less than respective threshold voltages of the first N-type transistor and x additional N-type transistors.

7. The integrated circuit of claim 1, wherein respective threshold forward voltages of the second Schottky diode and the second set of Schottky diodes are less than respective threshold voltages of the first P-type transistor and x additional P-type transistors.

8. The integrated circuit of claim 1, further comprising:
   a third N-type transistor including:
      a third N-type transistor input coupled to the output of the second N-type transistor, and
      a third N-type transistor output coupled to an input of the second N-type transistor; and
   a third P-type transistor including:
      a third P-type transistor input coupled to the output of the second P-type transistor, and
      a third P-type transistor output coupled to an input of the second P-type transistor.

9. The integrated circuit of claim 8, wherein the third N-type transistor and the third P-type transistor operate as feedback logic.

10. The integrated circuit of claim 1, wherein the first N-type transistor is coupled to a plurality of first N-type transistors in series.

11. The integrated circuit of claim 1, wherein the first Schottky diode is coupled to a plurality of first Schottky diode in parallel.

12. The integrated circuit of claim 1, wherein the integrated circuit is configured for asynchronous operation.

13. The integrated circuit of claim 1, wherein x is greater than or equal to 3.

14. The integrated circuit of claim 1, wherein the first Schottky diode is a P-type Schottky diode and the second Schottky diode is an N-type Schottky diode.

* * * * *